United States Patent [19]
Löffler et al.

[11] Patent Number: 6,032,233
[45] Date of Patent: Feb. 29, 2000

[54] STORAGE ARRAY ALLOWING FOR MULTIPLE, SIMULTANEOUS WRITE ACCESSES

[75] Inventors: Peter Löffler, Pliezhausen; Erwin Pfeffer, Holzgerlingen; Thomas Pflüger, Leinfelden; Hans-Werner Tast, Weil i.Schönbuch, all of Germany

[73] Assignee: International Business Machines Corporation, Armonk, N.Y.

[21] Appl. No.: 08/886,304

[22] Filed: Jul. 1, 1997

[30] Foreign Application Priority Data

Jun. 27, 1997 [EP]  European Pat. Off. .............. 97110556

[51] Int. Cl.⁷ ...................................................... G06F 12/02
[52] U.S. Cl. ........................... 711/155; 711/156; 711/160; 711/168; 711/173
[58] Field of Search ..................................... 711/144, 145, 711/156, 136, 168, 5, 160, 155, 173

[56] References Cited

U.S. PATENT DOCUMENTS 4,322,795  3/1982  Lange et al. .............................. 711/136
5,471,605  11/1995  Ruby ....................................... 711/118
5,611,072  3/1997  Tran ........................................ 711/136

*Primary Examiner*—Hiep T Nguyen
*Attorney, Agent, or Firm*—Marc A. Ehrlich

[57] ABSTRACT

A set of storage devices together with a method for storing data to the storage devices and retrieving data from the storage devices is presented. The set of storage devices provide the function of a multi-writeport cell through the use of a set of single-writeport cells. The storage devices allow for multiple write accesses. Information contained in the set of storage device is represented by all of the devices together. The stored information may be retrieved via a read operation which accesses a subset of the set of storage devices. A write operation is a staged operation: First, the contents of all of the storage devices which are not to be modified are read. Next, the values that are to be written to a subset B of the set of storage devices are calculated in a way that the contents and the values of subset B together represent the desired result.

25 Claims, 9 Drawing Sheets

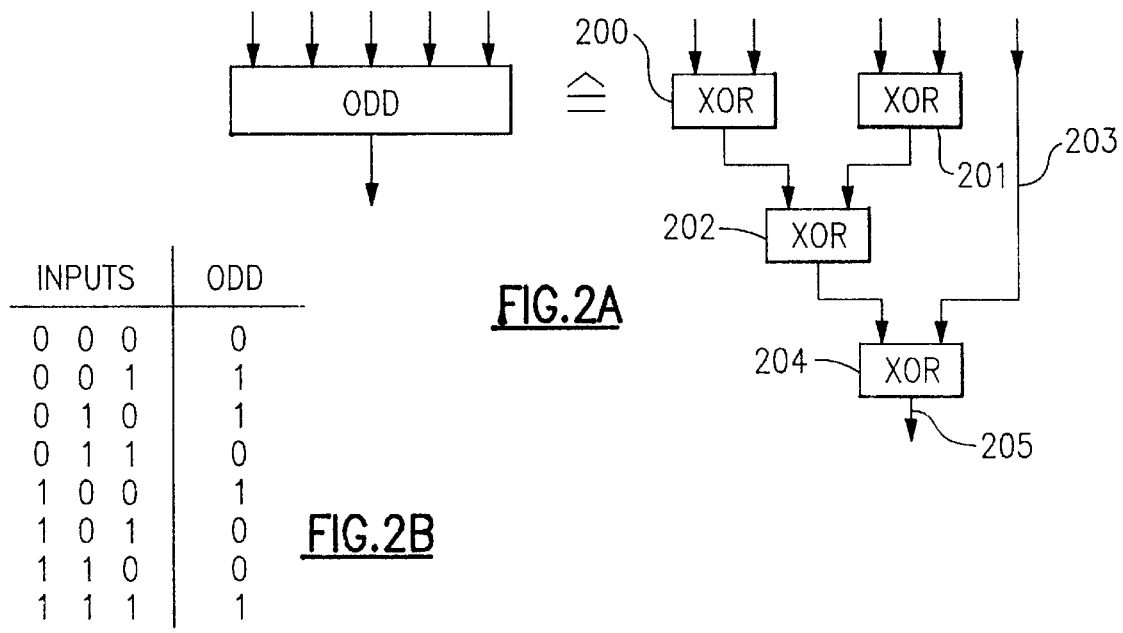
FIG.2A
| INPUTS | ODD |
|--------|-----|
| 0 0 0 | 0 |
| 0 0 1 | 1 |
| 0 1 0 | 1 |
| 0 1 1 | 0 |
| 1 0 0 | 1 |
| 1 0 1 | 0 |
| 1 1 0 | 0 |
| 1 1 1 | 1 |
FIG.2B
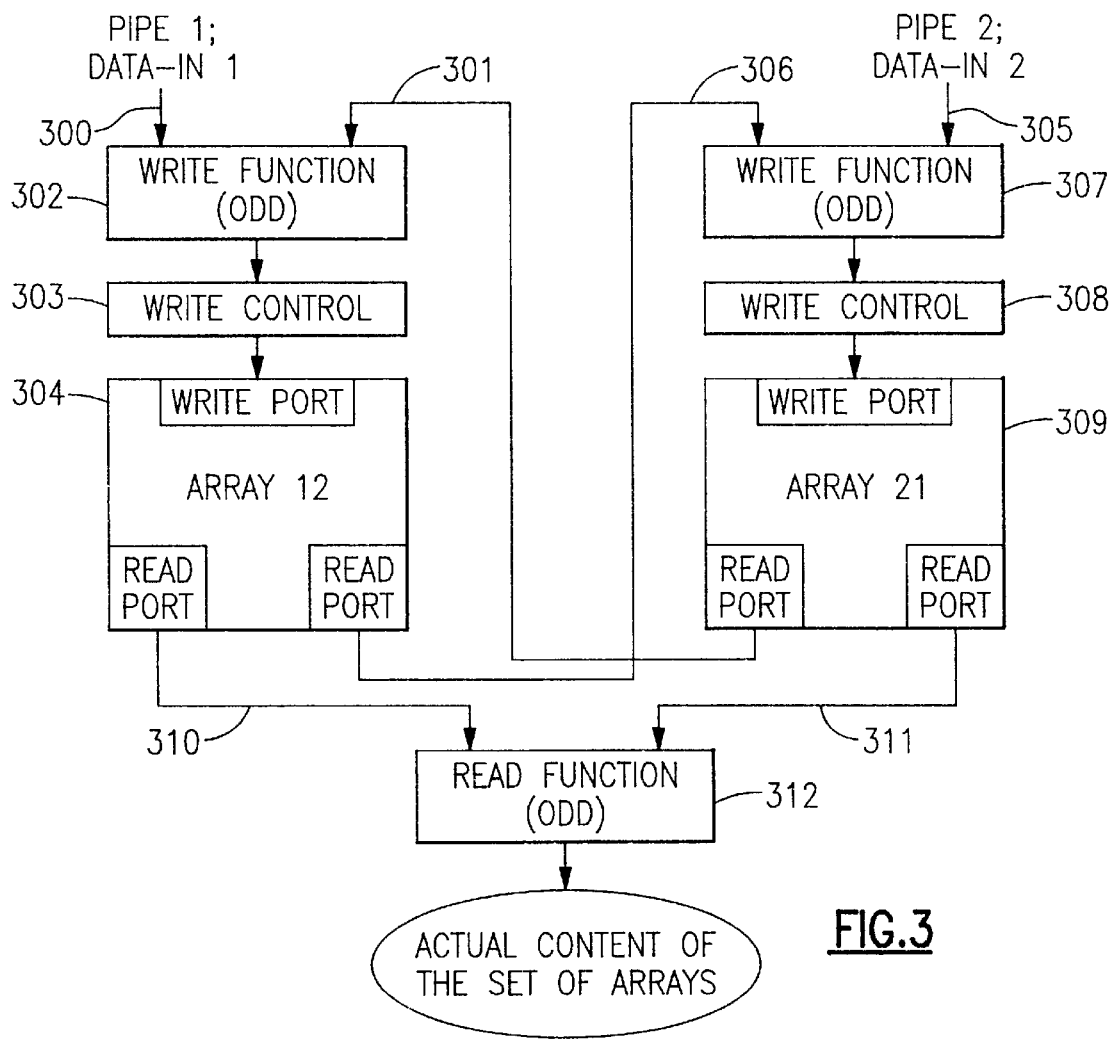
FIG.3

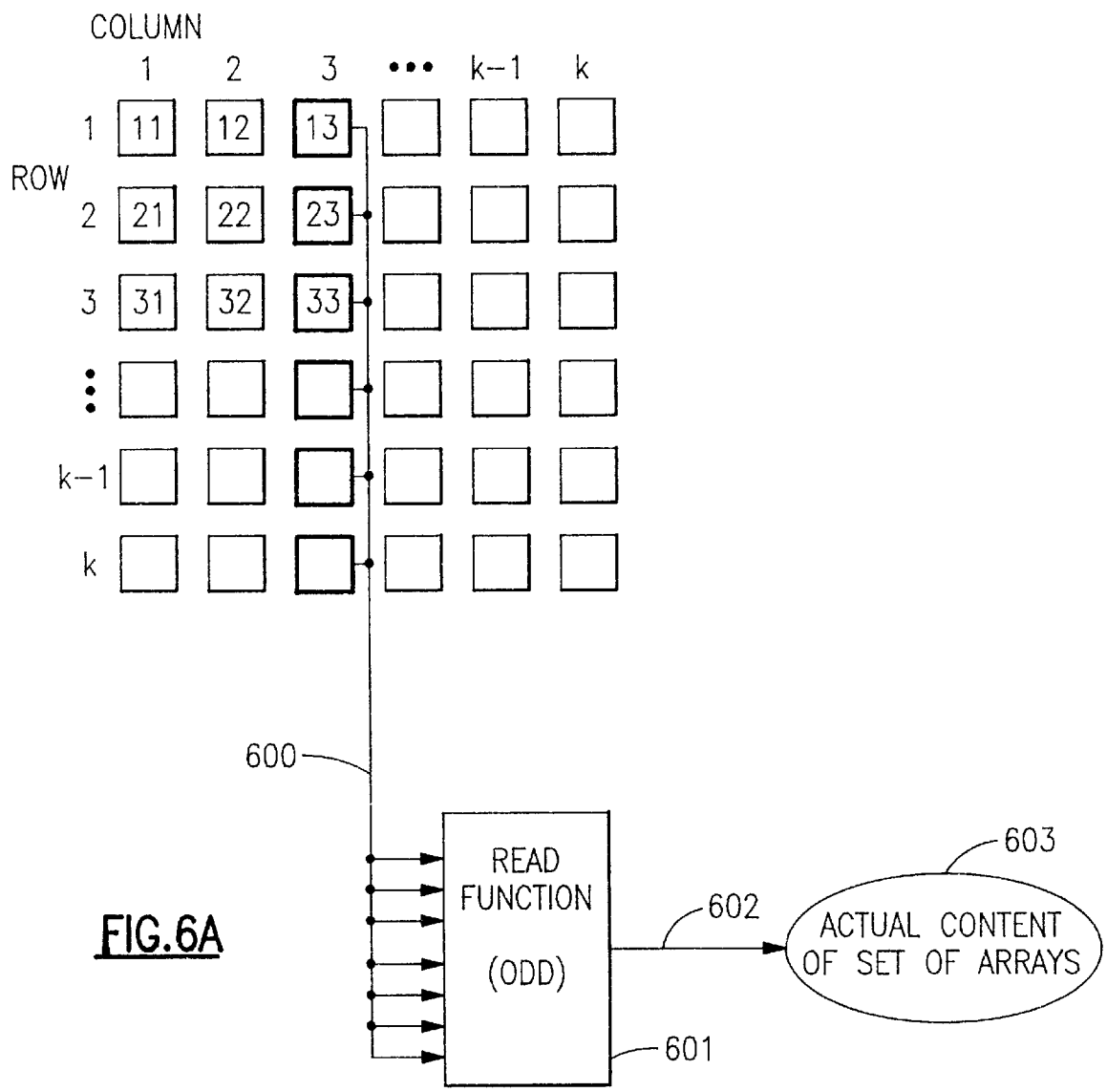

CHANGES TO MRU/LRU STATUS BITS

| MATCH ON COLUMN | X1 a–b | X2 a–c | X3 a–d | X4 b–c | X5 b–d | X6 c–d |
|---|---|---|---|---|---|---|
| $V_a$ | EVEN (800) | EVEN (801) | EVEN (802) | — (803) | — (804) | — (805) |
| $V_b$ | ODD (806) | — | — | EVEN (807) | EVEN (808) | — |
| $V_c$ | — | ODD (809) | — | ODD (810) | — | EVEN (811) |
| $V_d$ | — | — | ODD (812) | — | ODD (813) | ODD (814) |

"—" MEANS: "DON'T CHANGE"

FIG.8

STORAGE ARRAY ALLOWING FOR MULTIPLE, SIMULTANEOUS WRITE ACCESSES

FIELD OF THE INVENTION

The invention is related to storage devices and storage arrays, and especially to a storage device that permits for a multitude of simultaneous write- and read-accesses.

BACKGROUND OF THE INVENTION

A storage device, for example a storage array comprising a number of storage cells, is accessed via read-ports and write-ports. Whenever a read- or write-access to said storage array is to be performed, an address is applied to the storage array, and data is written to or read from the storage array via said read-ports and/or write-ports.

It is known to provide a number of read-ports and/or write-ports, in order to allow for simultaneous, separate read- and write-accesses, which may occur during one and the same clock-cycle.

As long as the simultaneous read- and write-accesses are directed to different addresses, no hazards occur, as each access reads from or writes to a different storage location. Even if two simultaneous read-accesses are directed via two separate read ports to one and the same storage address, there is no hazard. The content of said address is simply forwarded to both read ports that have addressed said storage location. Thus, simultaneous read-accesses to one storage location can easily be performed.

A more difficult situation arises as soon as one write- and one read-access are directed to one and the same address in storage. The data written to said storage address via a write port should be obtained, in the same cycle, by the read-access. This feature of immediately directing the data applied to a write port to a read port addressing the same storage location is called "write-through".

There are two ways how a write-through can be implemented. A first solution is to divide the clock cycle in a number of subcycles, with the first subcycle being responsible for the write-access, and with the read-access taking place during a second subcycle. Thus, it is possible to obtain, in the read-subcycle, data that has been written to said storage address during the write-subcycle, because said read-subcycle has been delayed with respect to said write-subcycle. Implementing a write-through via such a cascaded calculation implies that it is necessary to divide the clock-cycle in subcycles. This means that several subtasks have to be carried out, one after the other, in the same clock cycle, and therefore, each clock cycle has to be larger than a certain minimum length. Therefore, a subdivided clock cycle implies that the clock frequency can not be indefinitely augmented.

Another possible way of implementing a write-through is to provide extra logic at each of the write-ports and read-ports, in order to detect address matches between any of the write-ports and any of the read-ports. Whenever such a match is detected, data that is to be written to a certain storage location can immediately be forwarded to a respective read-port addressing said storage location. A disadvantage of the extra logic in the write- and read-paths is to be seen in the resulting performance degradation, and in the consumption of chip area.

Next, the case is to be considered that more than one write access towards a certain storage location occurs during one and the same cycle. In case identical data is written, via two different write ports, to one storage location, the solution to this hazard is rather simple: one pipe has to suppress the write-access of the other pipe, because one single write access is fully sufficient.

But there also exists the case that at least two write-accesses towards one address are performed in one and the same cycle, with said write accesses attempting to write different data. One could think of an array of status bits, which is accessed via several pipes. Each access may modify different bits, and therefore, the data written by each of the different write-accesses might differ. As it is necessary to record all changes to said status bits, even if they occur simultaneously, a total suppression of all except one of the write-accesses would not lead to correct results.

One solution to the problem of simultaneous write-accesses to one storage address is to provide means for a cascaded calculation of the write-accesses. In each subcycle, one write-access is taken care of, and by this sequential consideration of write-accesses, it is possible to maintain a correct status of the array at each point in time. Again, the disadvantage of dividing the clock-cycle is that limits are imposed on the maximum possible clock frequency.

Another solution to the problem of simultaneous write-accesses to one and the same storage address is to implement extra logic in the write paths in order to combine several write accesses to one resulting write-access. In case an array of status bits is updated via several write pipes, a large amount of difficult extra logic would be required which would slow down performance. Especially in case of a large number of write pipes, all possible combinations of write-accesses would have to be considered in said extra logic.

All the solutions described so far are based on one multiport cell being accessed by a plurality of write pipes via several write ports. Let us consider the example that said storage array holds status information which is updated, via several write pipes, by various on-chip facilities. This requires physical write paths connecting each of said facilities to the central array of said status bits. Thus, a multiport cell always represents a "hotspot", which has to be connected to a lot of different chip locations and which therefore imposes severe restrictions on chip layout and chip wiring.

OBJECT OF THE INVENTION

It is an object of the invention to provide a storage device having the functionality of a multi-writeport cell which allows to record simultaneous accesses to a storage location via a multitude of pipes while avoiding the drawbacks of prior art solutions.

It is a further object of the invention to replace a centralized multi-writeport cell by a distributed facility having the same functionality.

It is a further object of the invention to provide a storage device for keeping status information which is to be updated by multiple access paths which may perform their update simultaneously.

SUMMARY OF THE INVENTION

The object of the invention is solved by a set of storage devices according to claim 1, by a method for storing data to a set of storage devices according to claim 12, and by a method for obtaining data from a set of storage devices according to claim 13.

Instead of a multi-writeport cell, a set of storage devices is provided, in order to allow for multiple simultaneous accesses via different write-pipes. Whenever data contained in said set of storage devices is to be obtained, the contents of several storage devices of said set of storage devices have to be considered together. Useful information is not contained in one single storage device, but instead, the contents of a subset C (for example, a column) of said set of storage devices have to be combined. First, the contents of said subset C are read, next, a read-function is applied to said contents, in order to determine the actual content of said set of storage devices.

Distributing the useful information among a set of storage devices allows for a modification of said information via a write-access to any of said storage devices. Thus, simultaneous write-accesses via several pipes become possible. In order to modify the information represented by the set of storage devices, the following strategy is pursued: First, the contents of storage devices that will not be written to are read. Dependent on the status of these storage devices, and dependent on the desired content that is to be contained in the whole set of storage devices, it is calculated how another subset of the set of arrays has to be modified, in order to achieve that all the arrays, taken together, represent the desired content.

Therefore, the following steps are necessary for a write-access to said set of storage devices:

reading contents from a subset A of said set of storage devices;

applying a write-function to said contents of said subset A of said set of storage devices and to a first set of values that is to be contained in said set of storage devices in order to determine, as an output of said write-function, a second set of values that is to be written to a subset B of said set of storage devices, said subset A of said set of storage devices and said subset B of said set of storage devices not having a storage device in common;

writing said set of values to said subset B of said set of storage devices.

The proposed method for storing data to and obtaining data from a set of storage devices shows a number of advantages compared to a multi-writeport cell. One of these advantages is that simultaneous accesses to said set of storage devices may occur without requiring extra logic in the write paths, and without dividing the clock cycle in subcycles. This leads to performance improvements, as no delay is introduced to the write paths, and as the clock cycle can be rather short.

As the information is contained in all the storage devices of said set of storage devices, there is no "hotspot", as it was the case in a multi-writeport cell. The write-paths do not access one central storage device, but instead, each write path accesses a different storage device. This leads to a distributed solution, which simplifies the layout, and which allows to flexibly arrange the storage devices on-chip, in order to facilitate the wiring process.

Another advantage is that the set of storage devices proposed by the invention can be adapted to any number of write pipes. One can use simple storage devices comprising one read port and one write port, and with these simple devices, the functionality of a multi-writeport cell comprising k write pipes can be obtained.

Another advantage is that the set of storage devices proposed provides better conditions for testing. Usually, a storage device is tested by writing random patterns to it, by reading these patterns out again, and by comparing the input- and the output-pattern in order to obtain a signature. In case a fault occurs, this can be seen by observing said signature. When testing a multi-writeport cell by writing random patterns to the different writeports, a situation might occur where one write-pipe intends to write a "0" to a certain storage cell while another write pipe accesses the same cell with a "1". A non-defined state of the storage cell emerges. By using the set of storage devices according to the invention, random-pattern testing via the different write pipes can be performed and no such non-defined states arise. As testing becomes more and more important, this is a major advantage.

In a preferred embodiment of the invention said write-function and/or said read-function are realized as ODD-functions. The ODD-function is the easiest function fulfilling the requirements imposed on read- and write-functions. It can be implemented very easily as a cascade of XOR-gates, and does provide a simple and cheap solution.

According to a further embodiment of the invention, said subsets A and B of said set of storage devices being determined according to which of said write-pipes accesses said set of storage devices.

A correspondence between said subsets B to which a write access occurs, and the various write pipes is established. Only by directing the write-accesses of different write-pipes to different subsets B that do not have common elements, simultaneous write-accesses become possible.

In a further embodiment of the invention, said set of values contained in said set of storage devices being status information, and especially being MRU/LRU status information.

Status information is especially well suited to be contained in said set of storage devices, because status information has to be updated by a lot of different sources which may be located on different positions on-chip. Replacing a central "hotspot" multi-writeport cell by an arrangement of storage devices is especially useful for status information, as each facility that updates status information may access a corresponding storage device and simultaneous updates can be recorded.

BRIEF DESCRIPTION OF THE DRAWINGS

FIG. 2A shows how an ODD-function can be realized as a cascade of XOR-functions.

FIG. 2B shows the truth table of said ODD-function.

FIG. 3 shows an alternative implementation of a set of arrays comprising two write pipes, wherein the diagonal elements, array 11 and array 22, are omitted.

FIG. 6A shows a read-access in a k×k set of arrays which allows to accommodate k write pipes.

FIG. 8 indicates how the respective six MRU/LRU status bits X1, X2, . . . X6 have to be changed whenever an entry in one of the columns $V_a$, $V_b$, $V_c$ or $V_d$ is accessed.

DETAILED DESCRIPTION OF THE INVENTION

Figure 1A:
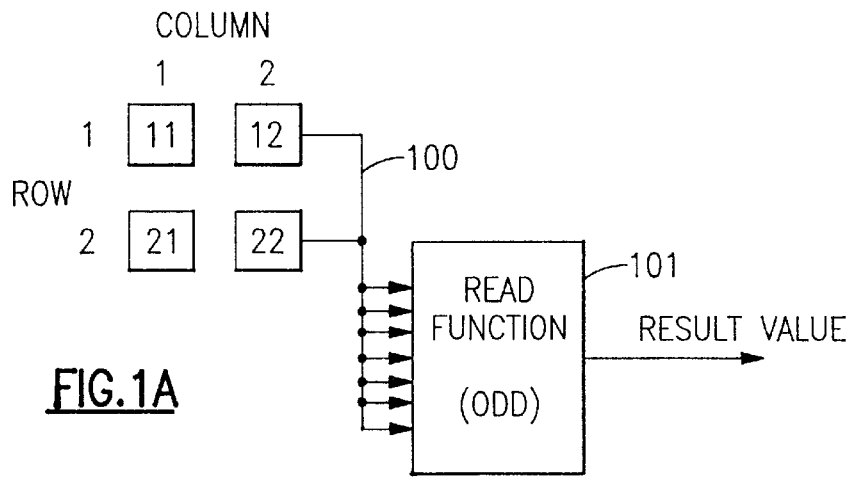
FIG. 1A shows how a result value can be obtained by condensing the contents of a set of arrays via a read function.

According to the invention, it is proposed to replace a single array to which data can be written, and from which data can be read, by a set of arrays, which is to contain the same information. In FIG. 1A, a set of four arrays, array 11, array 12, array 21, and array 22, is shown. The arrays are arranged in two columns and two rows. FIG. 1A shows how a read-access to said set of arrays is performed. None of the arrays 11, 12, 21, and 22, taken for itself, does contain valid data. In order to obtain valid data from said set of arrays, it is necessary to combine the information contained in all the arrays of any of the columns.

In FIG. 1A, the result value is obtained from the arrays of column 2. The contents of array 12 and array 22 are forwarded (100) to a facility 101 which applies a "read function" to these inputs. By means of said read function, the data of array 12 and array 22 is combined, in order to obtain the result values of said set of arrays. The ODD-function is an example of a possible read function.

Instead of condensing the contents of the arrays of column 2, it would also be possible to combine the contents of the arrays of column 1. The important point is that all the arrays of one column together constitute useful data, but that none of the arrays of the set, taken for itself, contains useful data.

Figure 1B:
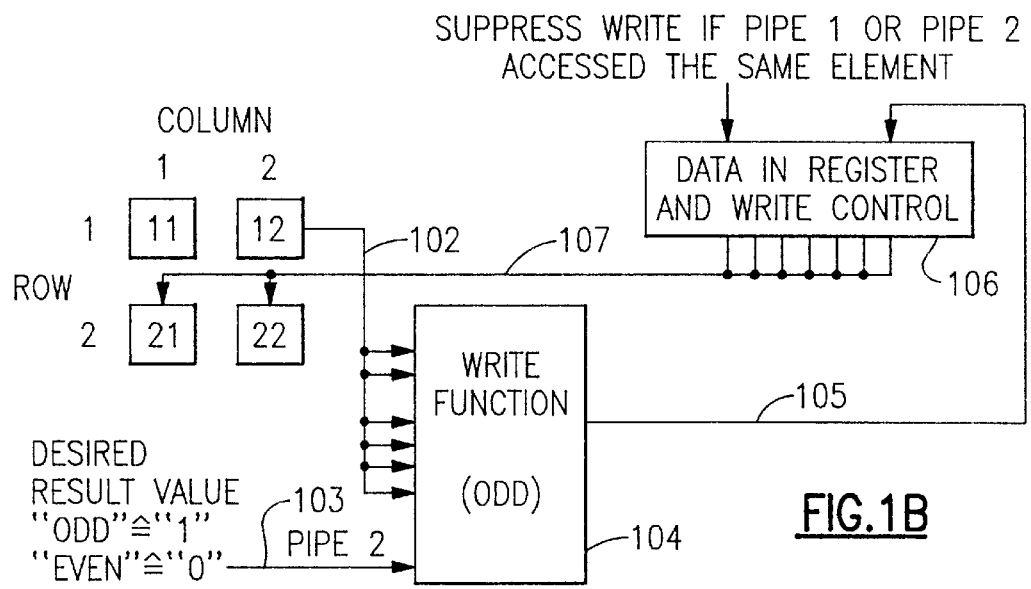
FIG. 1B shows how a write-access towards a set of arrays is performed via pipe 2.

FIG. 1B shows how a write-access to said set of arrays is performed via pipe 2 (103). A 2×2 set of arrays 11, 12, 21, and 22 allows to accommodate two write pipes.

Each write pipe will cause a write operation to the arrays of a row corresponding to said write pipe. In the case of FIG. 1B, a write-access via pipe 2 will cause a write operation to the arrays of row 2, which comprises array 21 and array 22 (107). The values that will be written to the arrays of row 2 are only meaningful when read in combination with the contents of other arrays, in this case with the contents of row 1.

Before the write operation is actually performed, the actual status of the set of arrays has to be determined. In order to do this, all the values of arrays in one column are forwarded (102) to a facility performing a write function (104). As the arrays of row 2 will be overwritten, it is not necessary to forward the contents of the arrays of this row to the write function. This is the reason why the content of array 22 is not forwarded to the write function. While the contents of the arrays of one column represent one input (102) to the write function, the desired result value constitutes the second input (103) of the write function (104). If the desired result is "ODD", a "1" is forwarded, via pipe 2 (103), to the write function. In case the desired result is "EVEN", a "0" is forwarded to the write function. The write function combines both the actual column contents, and the desired result values, in order to produce the output values that are to be written to row 2 (105).

Before said value can actually be written to row 2 (107), it has to pass a stage called "data in register and write control" (106). By means of this stage, conditions that enforce a suppression of the write access are considered. One of these conditions is that both pipe 1 and pipe 2 intend to write the same data to the same storage location. In this case, only the write access of pipe 1 is allowed to pass, while the write access of pipe 2 is suppressed. This condition is checked for at the write control facility 106.

In case the write access is allowed to pass, the value calculated by the write function 104 will be written to the arrays of the row corresponding to the write pipe that initiated the write access.

The purpose of the write function is to produce, from the actual column contents, and from the desired result value, the value that is to be written to one row. The output value of the write function has to be calculated in a way that, when combining the contents of any column, the desired result value will be obtained. A possible mathematical function that can be employed at this stage is the ODD-function. The ODD-function will return a "0" at its output, if an even number of "1's" is applied to its inputs, and it will return a "1" in case an odd number of "1's" is applied to its inputs. Besides the ODD-function, one could think of other mathematical functions which could be used as read-or write-functions.

Figure 1C:
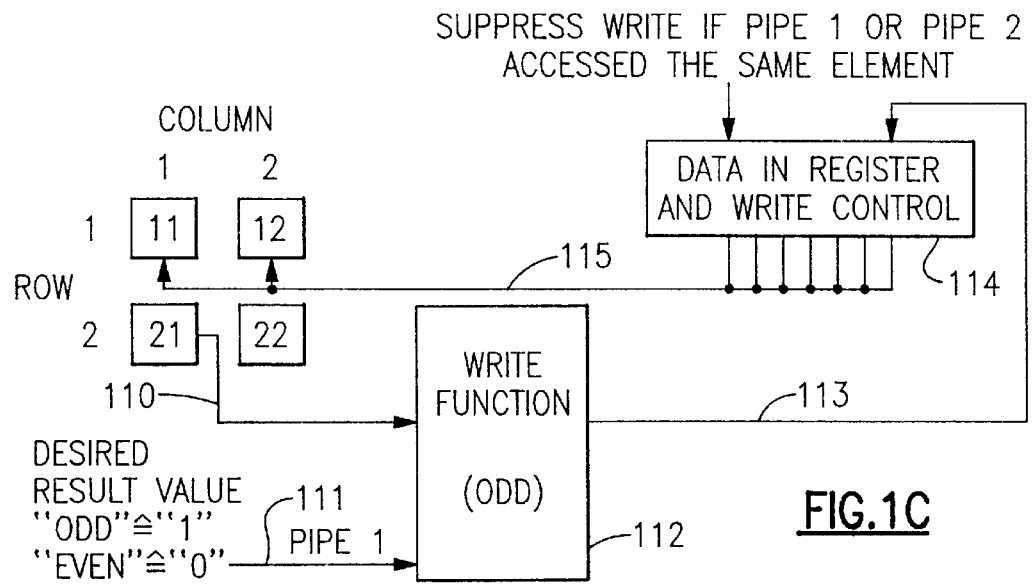
FIG. 1C shows how a write-access towards a set of arrays is performed via pipe 1.

In FIG. 1C, a write access, via pipe 1, to the set of arrays is shown. Again, as a first step, the actual content of the set of arrays is accessed by forwarding (110) the contents of one column (here column 1) to the write function 112 as a first input. The desired result value is forwarded, as a second input, via pipe 1 (111) to the write function. From these two inputs, the write function produces the value that is to be written to the row of arrays corresponding to pipe 1, which is row 1 in FIG. 1C. Before the output value of the write function is written to the arrays of said row, it has to pass the "write control" stage (114), in which conditions for suppressing the write access are checked. In case the write access is allowed, the output value of the write function is written to the arrays 11 and 12 of row 1 of the set of arrays.

FIG. 2A shows how an ODD-function can be realized by a cascade of XOR-gates having two inputs each. At the first stage, comprising the XOR-gates 200 and 201, the five initial inputs are condensed to three signal lines. Two of these signal lines are used as an input to the XOR-gate 202 of the second stage, which produces one output. This output, together with input 203, is forwarded to XOR-gate 204 of the third stage, which produces the final output of the ODD-function 205. The setup of such an XOR-cascade can be summarized as follows: As many inputs of each stage as possible are condensed by said stage, the remaining signal lines are forwarded to the next stage.

FIG. 2B shows the truth table of an ODD-function having three inputs. Whenever an odd number of the inputs is equal to "1", the output of the ODD-function is equal "1", too. Whenever an even number of inputs is equal to "1", the output of the ODD-function will be "0". By means of the ODD-function, any number of inputs can be condensed to one output.

FIG. 3 shows a simplified implementation of a set of arrays having two write pipes. The two diagonal elements of the set of arrays, array 11 and array 22, have been omitted. With such a simplified set of arrays, the same functionality as described in FIGS. 1A, 1B and 1C can be achieved, though.

When performing a write-access via pipe 1 (300), it is only necessary, as can be seen from FIG. 1C, to forward (301) the actual content of array 21 (309) to the respective write function 302. It is not necessary to access any of arrays 11 or 22. The output of write-function 302 is forwarded, via the write control 303, to the write port of array 12 (304). This is different from the situation depicted in FIG. 1C, where the output of the write-function is written to all the arrays (array 11 and array 12) of row 1. As array 11 has been omitted in FIG. 3, only a write access to array 12 is performed (304).

When carrying out a write access via pipe 2, the situation is similar. As in FIG. 1B, the content of array 12 (304) is forwarded (306), as a first input, to the write-function 307. Pipe 2 (305) constitutes the second input of write-function 307. From both values, the write-function 307 determines the value that is to be written to the row corresponding to pipe 2. As array 22 has been omitted, the output value of write function 307 is only written, via write control 308, to the write port of array 21 (309), which is the only remaining array of row 1 in the set of arrays.

The question arises whether it is possible to obtain valid result values from this reduced set of arrays. When looking at FIG. 1A, one might get the impression that either the complete column 1 or the complete column 2 is necessary for determining the actual content of the set of arrays. But actually, the read-function can still be performed when the arrays 11 and 22 are omitted. When a write-access to a set of arrays is performed, one whole row of the set of arrays is addressed. This implies that array 21 always contains the same information as array 22 (as can be seen from FIG. 1B) and that array 12 always contains the same information as array 11 (as can be seen from FIG. 1C).

Therefore, for performing a valid read-function, the only prerequisite is to choose one array of row 1 and one array of row 2, and combine the contents of these two arrays by means of the read-function. The actual value of the set of arrays of FIG. 3 can be obtained by forwarding (310, 311) the content of array 12 (304) and of array 21 (309) to the read function 312, because array 12 is a member of row 1 and array 21 is a member of row 2. Thus, it is shown that even with the reduced set of arrays according to FIG. 3 the whole functionality of FIG. 1A, 1B and 1C can be obtained. It has to be noted, however, that for a solution according to FIG. 3, both array 12 and array 21 have to have two read ports each, one read port serving as an input to the read-function and the other read port serving as an input to the write-function.

Figure 4:
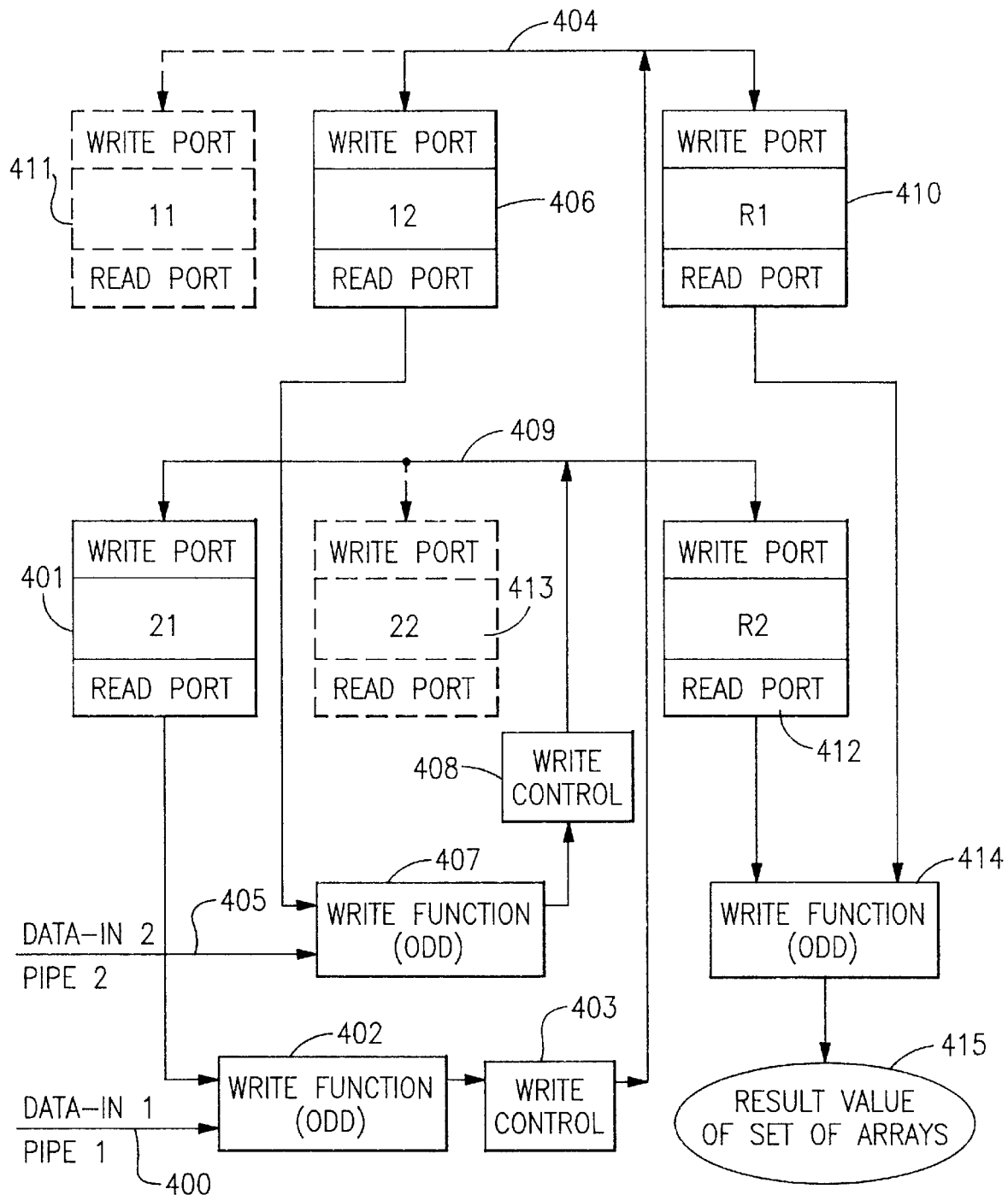
FIG. 4 depicts how extra read arrays R1 and R2 may be provided, which are to replace the diagonal elements.

It is obvious from what has been described so far that the "diagonal" arrays, the arrays 11 and 22, are primarily useful for obtaining the actual content of the set of arrays by means of the read-function. A further embodiment for a set of arrays having two write pipes, in which the arrays are arranged in a different way, is given in FIG. 4. As in previous solutions, the content of array 21 (401) is read out and provided as a first input to the write function 402. Pipe 1 (400) provides the second input of write function 402. Next, the output of write function 402 is passed through the write control 403. In previous solutions (FIG. 1C), this output was written to array 11 and array 12. In the solution of FIG. 4, array 11 (411) has been replaced by read array R1 (410). The output value of write-function 402 is now written (404) to both the array 12 (406) and to the read array R1 (410).

The write path of pipe 2 (405) works accordingly. Pipe 2 (405) serves as a first input to write function 407, and the content of array 12 (406) is forwarded, as a second input, to said write function. Again, there exists a write control (408), which the output value has to pass, and which may suppress the write access. In previous solutions, the output was written to row 2 (FIG. 1B) of the set of arrays, comprising array 21 (401) and array 22 (413). Array 22 has been replaced by the read array R2 (412).

In order to read out the actual value contained in the set of arrays, the read-function of FIG. 1A accessed the arrays contained in one column. The value could be obtained by addressing the arrays 11 and 21, or by addressing the arrays 12 and 22. The disadvantage of this solution is that the arrays 12 and 21 are addressed both by the read function and the write function. Therefore, two read-ports are necessary.

The solution depicted in FIG. 4 performs the read access via the read arrays R1 (410) and R2 (412), which can be thought of as substitutes for the arrays 11 and 22. As read array R1 (410) is updated whenever a write access (404) to row 1 occurs, and as read array R2 (412) is updated whenever a write access (409) to row 2 occurs, the read arrays R1 and R2 together contain the full information of the set of arrays. Both read arrays 410 and 412 are accessed by the read-function 414, which calculates, from the contents of said read-arrays, the values actually contained in said set of arrays (415). An advantage of this solution is that each of the arrays used, the array 12, the array 21, the array R1 and the array R2, only has to have one single read-port. In the other solutions described so far, the arrays 12 and 21 had to provide at least two read-ports.

Figure 5:
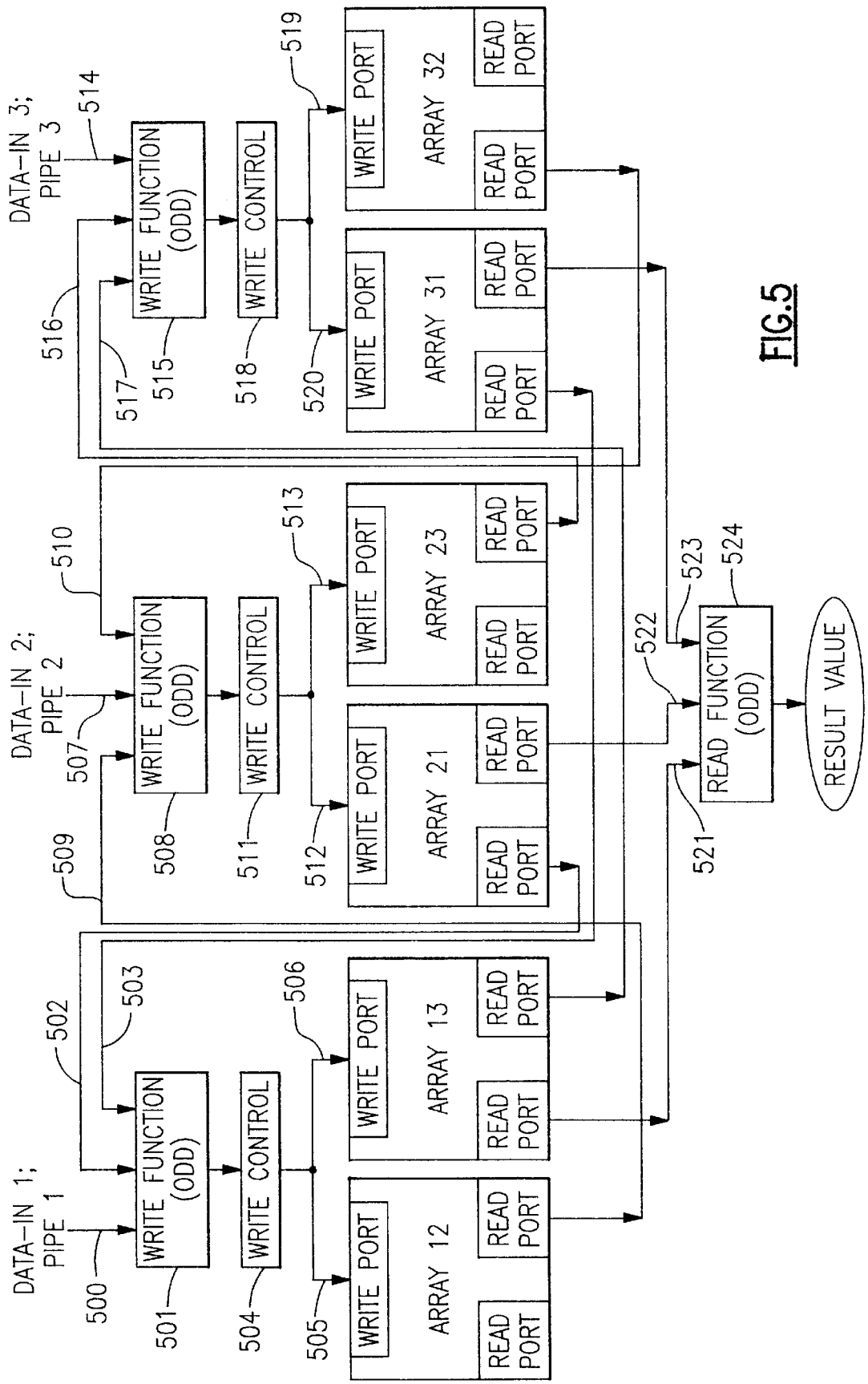
FIG. 5 shows an alternative setup for a set of arrays comprising three write pipes, wherein the arrays 11, 22 and 33 have been omitted.

FIG. 5 shows an implementation for a set of arrays being accessed via three write pipes, whereby the "diagonal" arrays 11, 22, and 33 have been omitted. Thus, it has been possible to reduce the number of arrays necessary from 9 to 6. This allows to reduce the required chip space by one third. In order to compensate for the lower number of arrays necessary, at least three of the arrays have to be provided with two read ports. But still, FIG. 5 represents a cheap and easy-to-implement solution for the problem of an array that allows for simultaneous write-accesses via different write pipes.

Let us first consider a write-access occurring via pipe 1 (500). Together with the data of pipe 1, the contents of array 21 (502) and of array 31 (503) are forwarded to the write function 501. Array 21 and array 31 are the elements of column 1 which do not occur in row 1, and which will therefore not be modified by a write access via pipe 1. From these three inputs, the write function 501 calculates an output value, which is forwarded to the write control 504. In case the write access is not to be suppressed, the output value of write function 501 is written to all the arrays of row 1. Array 11 has been omitted, though. Therefore, only array 12 and array 13 of row 1 are accessed (505, 506), via their respective write ports.

A write-access via pipe 2 (507) is performed accordingly. Besides the data forwarded by pipe 2, the write function 508 has to receive the inputs of all the arrays of column 2 except for those contained in row 2, because row 2 is the row that will be modified by the write accesses. Therefore, the values of array 12 (509) and 32 (510) have to be forwarded to the write-function 508. From its three inputs, the write-function 508 produces an output that has to be written, after having passed the write control 511, to all the elements of row 2. As array 22 has been omitted, data is written to array 21 (512) and to array 23 (513).

When looking at the write access performed via pipe 3 (514), it is obvious that the arrays 13 and 23 of column 3 have to be forwarded to write-function 515. The output of said write function is written to the arrays 31 and 32 (520, 519) of row 3.

In order to be able to determine the actual content of the set of arrays comprising the arrays 13, 23, 21, 23, 31 and 32, it is necessary to pick one array per row of said set of arrays. For row 1, there are two candidates, array 12 and array 13. In the example of FIG. 5, array 13 has been picked; its data is forwarded (521) to the read function 524. Either array 21 or array 23 may be picked, in order to provide one representant of row 2 to the read function 524. It doesn't matter whether array 21 or 23 is chosen, because both are equivalent in the sense that they contain the same data. This becomes clear when considering that they have the same write path (512, 513). In our example, array 21 is chosen as an input (522) to the read-function 524. From the possible candidates of row 3, array 31 and array 32, array 31 is picked. Its content is forwarded (523), as a third input, to read-function 524. By applying said read-function 524 to its three inputs 521, 522 and 523, the actual content of the set of arrays can be evaluated.

Figure 6B:
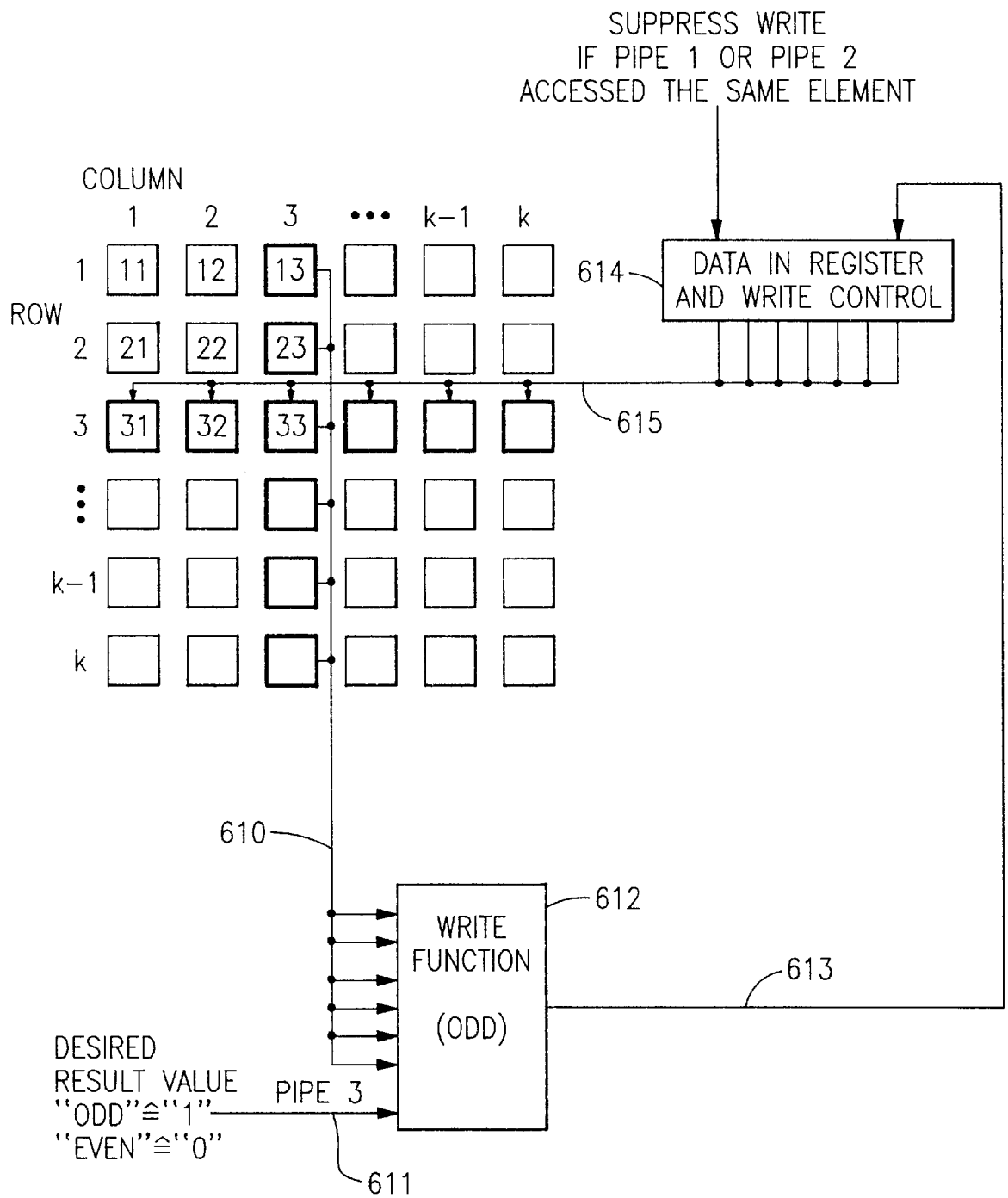
FIG. 6B shows how a write-access via pipe 3 towards said set of k×k arrays is performed.

In FIG. 6A and 6B, the concept of the invention is extended to a set of k×k arrays, which permits to accommodate k write pipes, which may perform up to k simultaneous write-accesses to said set of arrays. The arrays of said set of arrays are arranged in k rows and k columns.

FIG. 6A shows how the actual content of said set of arrays can be determined by accessing any column of said set of arrays. In the example, all the contents of the arrays of column 3 are read out and forwarded (600) to the read function 601, which might, for example, be an ODD-function. The contents of all the arrays of column 3 are condensed to an "array" of output values (602), and thus, the actual content of the set of arrays is determined (603).

FIG. 6B shows the case of a write-access, via pipe 3, to a k×k set of arrays. A write-access via pipe 3 (611) will modify the contents of the arrays of row 3. The task is to determine which values will have to be written to row 3, in order to achieve that the actual total content of the set of arrays will be equal to the desired result value given via pipe 3. The contents of all the arrays of one column which are not part of row 3 are forwarded (610) to facility 612. There, the contents of these arrays, together with the desired result value given via pipe 3 (611) are condensed by means of a write-function, which might, for example, be an ODD-function. The output of this arithmetic operation (613) constitutes the content that is to be stored to all the arrays of row 3 of the set of arrays. Before the store operation is actually performed, the output value is forwarded to a "data-in register and write control" stage (614), where a check is made whether any other of the k pipes performs a write-access to the same address as the pipe under consideration. If the addresses of two pipes match, it is checked whether both pipes intend to write equivalent data. If this is also the case, one of the two write-accesses has to be suppressed. In case the write-access of pipe 3 in the example of FIG. 6B is not suppressed, the output value is written to all the arrays of row 3 (615).

Figure 7:
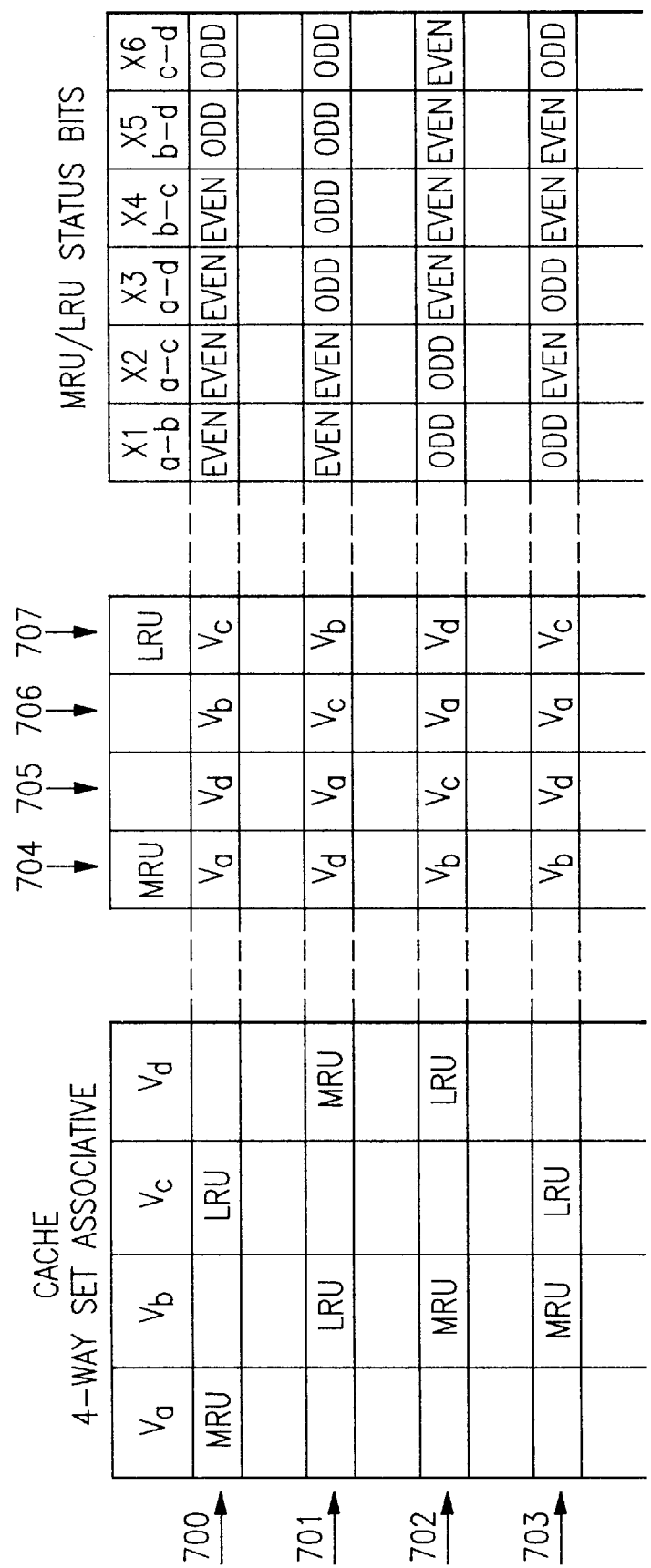
FIG. 7 shows how MRU/LRU status bits are used to indicate the order of entries in a four-way set associative cache.
Figure 9:
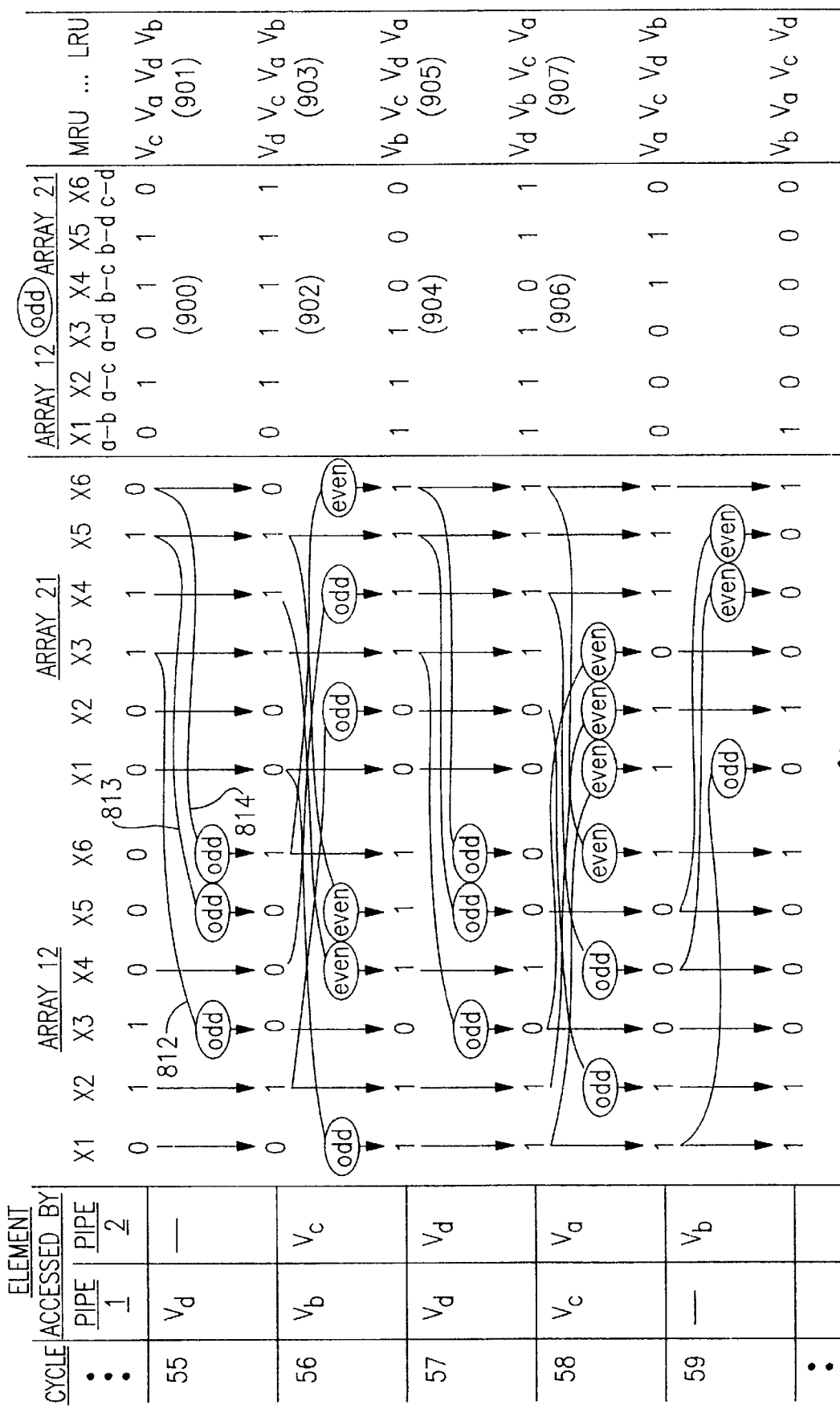
FIG. 9 shows how MRU/LRU information can be stored and updated in a set of arrays comprising two write pipes.

In FIG. 7 to 9, it is shown how the method for simultaneously performing write-accesses to a set of arrays can be applied to an array of MRU/LRU status bits in cache management. Cache replacement algorithms base their replacement strategies on said MRU/LRU status bits, which are updated from various sources.

In FIG. 7, a four-way set associative cache comprising four columns $V_a$, $V_b$, $V_c$, and $V_d$ for holding cache entries is shown. A hash function of the address is used for accessing the cache, which means that a certain row, comprising four entry positions, is specified by said hash function of the address.

Depending on the history of accesses that have occurred to the entries of one row, an order between the entries can be established, depending on the last time an entry has been accessed. Thus, one of the four entries is the most recently used entry (MRU), one is the second-most recently used entry, another entry being the third-most recently used entry, and one entry being the least recently used entry (LRU). Of course, the order is different for each row. For example, in row 700, $V_a$ is the most recently used entry (704), $V_d$ is the second-most recently used entry (705), $V_b$ is the third-most recently used entry (706) and $V_c$ is the least recently used entry. In row 701, $V_d$ is the most recently used entry (704), $V_a$ is the second-most recently used entry (705), $V_c$ is the third-most recently used entry (706), and $V_b$ is the least recently used entry (707).

Whenever a new entry is to be written to a certain row, it is necessary to erase one of the four entries. A cache replacement algorithm will choose the entry that is least recently used for being replaced. Therefore, the LRU entry is the entry that will be replaced by a new entry.

The order of the four cache entries of one row is indicated by the MRU/LRU status bits X1, X2, . . . X6. For each status bit, there exist two states: "EVEN" and "ODD". For example, X1 indicates which of the entries $V_a$ and $V_b$ has been more recently used. If, as it is the case in row 700, $V_a$ has been more recently used than $V_b$, X1 is set to "EVEN". Bit X2 shows which of the entries $V_a$ and $V_c$ has been more recently used; it is set to "EVEN" if $V_a$ has been more recently used than $V_c$ (also this is true in row 700). Accordingly, X3 monitors whether $V_a$ has been more recently used than $V_d$. In row 700, $V_a$ is more recently used than $V_d$, and therefore, X3 is set to "EVEN". Bit X4 indicates whether $V_b$ has been more recently used than $V_c$, and this is also true for row 700. X5 monitors the relationship between $V_b$ and $V_d$. In row 700, $V_d$ is more recently used than $V_b$, and therefore, X5 is set to "ODD". The same holds for X6, which indicates whether $V_c$ or $V_d$ is more recently used. As $V_d$ is more recently used in row 700, X6 is set to "ODD". For the entries given in row 701, 702 and 703, the resulting MRU/LRU status bits are given as well.

FIG. 8 indicates how the MRU/LRU status bits X1, X2, . . . X6 have to be changed when an entry in one of the columns of the cache, $V_a$, $V_b$, $V_c$, or $V_d$, is accessed.

In case the entry in column $V_a$ is accessed, the new entry written to column $V_a$ is the entry that has been most recently used, because the latest access to the cache was directed towards column $V_a$. Therefore, $V_a$ is more recently used than $V_b$, $V_c$, and $V_d$, and therefore, the MRU/LRU status bits X1, X2, and X3 have to be changed accordingly. This implies that X1 has to be set to "EVEN" (800), X2 has to be set to "EVEN" (801), and X3 has to be set to "EVEN" (802) as well. The status bits X4, X5 and X6 do not relate to $V_a$. Instead, they refer to the relative order of $V_b$, $V_c$, and $V_d$, which is not changed by an access of column $V_a$. Therefore, the status bits X4, X5 and X6 remain as they are (803, 804, 805), and no changes are made to these status bits.

Accordingly, when an access of column $V_b$ occurs, X1 has to be "ODD" (806), X4 has to be "EVEN" (807), and X5 has to be "EVEN" (808). All the other bits (X2, X3, X6) are not to be changed.

In FIG. 9, it is shown how MRU/LRU status information can be contained and updated in a set of two arrays, array 12 and array 21. The implementation used here is identical to the implementation given in FIG. 3.

Neither array 12 nor array 21, taken for itself, does contain valid MRU/LRU status information. Valid status bits can only be obtained by combining the contents of array 12 and array 21. This is performed by means of read-function 312, which performs an ODD-operation on the contents of array 12 and array 21. Initially, array 12 holds the bit pattern "011000", while array 21 holds the pattern "001110". The result of the ODD-function is "010110" (900). This corresponds to the MRU/LRU pattern $V_c$, $V_a$, $V_d$, $V_b$ (901).

The system possesses two write-pipes. In cycle 55, a write access to $V_d$ via pipe 1 occurs. According to FIG. 8, this means that X3 has to be changed to "ODD" (812), X5 has to be changed to "ODD" (813), and X6 has to be changed to "ODD" (814) as well. Therefore, in a first step, bits X3, X5 and X6 are read from array 21. Next, the values of these bits are inverted (812, 813, 814) and forwarded to array 12. The other bits, bit X1, X2 and X4 of array 12, remain unchanged. When XORing the new contents of array 12 and array 21, the bit pattern "011111" (902) emerges, which represents the following order of entries: "$V_d$-$V_c$-$V_a$-$V_b$" (903). This means that the method has been successful in indicating $V_d$ as the most recently used entry.

In cycle 56, pipe 1 accesses $V_b$, and pipe 2 accesses $V_c$. The bit X1, X4 and X5 of array 21 are modified according to FIG. 8, and written to array 12. The bits X2, X4, and X6 of array 12 are also modified according to FIG. 8, and written to array 21. All the other bits (bits X2, X3 and X6 of array 12 and bits X1, X3 and X5 of array 21) remain unchanged. After performing the ODD-function on the new contents of array 12 and array 21, the bit pattern "111000" (904) emerges, which represents the entry sequence "$V_b$-$V_c$-$V_d$-$V_a$" (905). Thus, both write accesses, to $V_b$ and $V_c$, have been recorded correctly.

We claim:

1. A set of storage devices, comprising:
   means for reading contents from a subset A of the set of storage devices;
   means for writing a set of values to a subset B of the set of storage devices;
   said subset A of the set of storage devices and said subset B of the set of storage devices not having a storage device in common;
   means for determining, by applying a write function to said contents of said subset A of the set of storage devices and to a first determined value that is to be contained in the set of storage devices, a second value that is to be written to said subset B of the set of storage devices;
   means for reading contents from a subset C of the set of storage devices;
   said subset A of the set of storage devices and said subset C of the set of storage devices having at least one storage device in common;
   said subset B of the set of storage devices and said subset C of the set of storage devices having at least one storage device in common; and
   means for determining, by applying a read-function to said contents of said subset C of the set of storage devices, a set of values that is actually contained in the set of storage devices.

2. A set of storage devices according to claim 1, further characterized by said write-function being an ODD-function.

3. A set of storage devices according to claim 1, further characterized by
   said read-function being an ODD-function.

4. A set of storage devices according to claim 2, further characterized by
   said ODD-function being implemented as a cascade of XOR-gates.

5. A set of storage devices according to claim 1, further comprising more than one write-pipe for performing write-accesses, whereby more than one write-access may occur simultaneously via different write-pipes.

6. A set of storage devices according to claim 5, further characterized by
   said subsets A and B of the set of storage devices being determined according to which of said write-pipes accesses the set of storage devices.

7. A set of storage devices according to claim 5, further characterized by
   the set of storage devices having k rows of k storage devices each, and k columns of k storage devices each
   and, in case write-pipe i accesses the set of storage devices
   said subset A of the set of storage devices comprises all storage devices contained in column i of the set of storage devices except for the storage device contained both in column i and row i;
   said subset B of the set of storage devices comprises all storage devices contained in row i of the set of storage devices;
   said subset C of the set of storage devices comprises all storage devices contained in column i of the set of storage devices.

8. A set of storage devices according to claim 7, further characterized by
   each of said storage devices comprising at least one write-port and at least one read-port.

9. A set of storage devices according to claim 7, further characterized by
   each of said storage devices being an array of storage cells.

10. A set of storage devices according to claim 7, further characterized by
    the set of values contained in the set of storage devices being status information.

11. A set of storage devices according to claim 7, further characterized by
    the set of values contained in the set of storage devices being MRU/LRU status information.

12. A method for storing data to a set of storage devices, comprising the steps of:
    reading contents from a subset A of the set of storage devices;
    applying a write-function to said contents of said subset A of the set of storage devices and to a first determined value that is to be contained in the set of storage devices, in order to determine, as an output of said write-function, a second value that is to be written to a subset B of the set of storage devices;
    said subset A of the set of storage devices and said subset B of the set of storage devices not having a storage device in common; and
    writing said value to said subset B of the set of storage devices.

13. A method according to claim 12 wherein data may be obtained from the set of storage devices, further comprising the steps of:
    reading contents from a subset C of the set of storage devices,
    applying a read-function to the contents of said subset C of the set of storage devices, in order to determine the set of values that is actually contained in the set of storage devices.

14. A method according to claim 12, further characterized by said write-function being an ODD-function.

15. A method according to claim 14, further characterized by
    said ODD-function being implemented as a cascade of XOR-gates.

16. A method according claim 13, further characterized by said read-function being an ODD-function.

17. A method according to claim 16, further characterized by said ODD-function being implemented as a cascade of XOR-gates.

18. A method according to claim 13, further comprising more than one write-pipe for performing write-accesses, whereby more than one write-access may occur simultaneously via different write-pipes.

19. A method according to claim 18, further characterized by said subsets A and B of the set of storage devices being determined according to which of said write-pipes accesses the set of storage devices.

20. A method according to claim 18, further characterized by the set of storage devices having k rows of k storage devices each, and k columns of k storage devices each and, in case write-pipe i accesses the set of storage devices said subset A of the set of storage devices comprises all storage devices contained in column i of the set of storage devices except for the storage device contained both in column i and row i;

said subset B of the set of storage devices comprises all storage devices contained in row i of the set of storage devices;

said subset C of the set of storage devices comprises all storage devices contained in column i of the set of storage devices.

21. A method according to claim 13, further characterized by each of said storage devices comprising at least one write-port and at least one read-port.

22. A method according to claim 13, further characterized by each of said storage devices being an array of storage cells.

23. A method according to claim 13, further characterized by the set of values contained in the set of storage devices being status information.

24. A method according to claim 13, further characterized by the set of values contained in the set of storage devices being MRU/LRU status information.

25. A set of storage devices according to claim 3, further characterized by said ODD-function being implemented as a cascade of XOR-gates.

* * * * *